United States Patent
Sato

(10) Patent No.: US 7,583,180 B2
(45) Date of Patent: Sep. 1, 2009

(54) SEMICONDUCTOR DEVICE FOR PASSIVE RFID, IC TAG, AND CONTROL METHOD THEREOF

(75) Inventor: Kotaro Sato, Kanagawa (JP)

(73) Assignee: Nec Electronics Corporation, Kawasaki, Kanagawa (JP)

(*) Notice: Subject to any disclaimer, the term of this patent is extended or adjusted under 35 U.S.C. 154(b) by 242 days.

(21) Appl. No.: 11/176,446

(22) Filed: Jul. 8, 2005

(65) Prior Publication Data

US 2006/0007771 A1    Jan. 12, 2006

(30) Foreign Application Priority Data

Jul. 12, 2004    (JP)    ............................. 2004-204500

(51) Int. Cl.
*G11C 5/14* (2006.01)
(52) U.S. Cl. ................. 340/10.51; 340/10.52; 340/10.1; 340/10.4; 365/192; 365/203; 365/204
(58) Field of Classification Search ............... 340/10.51, 340/10.52, 10.4, 10.41, 10.42, 10.3, 10.31; 365/192, 191, 228, 226, 189.06, 189.09, 365/203, 204, 210.12
See application file for complete search history.

(56) References Cited

U.S. PATENT DOCUMENTS

| | | | |
|---|---|---|---|
| 5,521,590 A | * | 5/1996 | Hanaoka et al. .......... 340/10.51 |
| 6,046,676 A | * | 4/2000 | Ward et al. ................ 340/572.1 |
| 6,515,919 B1 | * | 2/2003 | Lee ............................. 365/192 |

FOREIGN PATENT DOCUMENTS

| JP | 08-094743 | 4/1996 |
|---|---|---|
| JP | 11-066248 | 3/1999 |

OTHER PUBLICATIONS

Udo Karthaus et al., "Fully Integrated Passive UHF RFID Transponder IC With 16.7uW Minimum RF Input Power", IEEE Journal of Solid-State Circuits, vol. 38, No. 10, Oct. 2003, pp. 1602-1608.
Japanese Office Action dated Dec. 2, 2008 (with English translation).

* cited by examiner

*Primary Examiner*—Brian A Zimmerman
*Assistant Examiner*—Yong Hang Jiang
(74) *Attorney, Agent, or Firm*—McGinn IP Law Group, PLLC

(57) ABSTRACT

A semiconductor according to an embodiment of the invention has a supply voltage generator circuit generating a supply voltage based on a received radio signal, a voltage detector circuit detecting a reference voltage dependent on the supply voltage, a memory circuit storing data, and a control circuit executing write operation to the memory circuit according to a reference voltage detected by the voltage detector circuit.

13 Claims, 12 Drawing Sheets

RELATED ART

| OPERATION<br>SUPPLY VOLTAGE | LOGIC CIRCUIT OPERATION | WRITE OPERATION OF EEPROM | WRITE OPERATION OF IC TAG |
|---|---|---|---|
| LOWER THAN LOGIC CIRCUIT THRESHOLD | × | × | × |
| BETWEEN LOGIC CIRCUIT THRESHOLD AND BOOST THRESHOLD | ○ | × | △ |
| HIGHER THAN BOOST THRESHOLD | ○ | ○ | ○ |

FIG. 13

SEMICONDUCTOR DEVICE FOR PASSIVE RFID, IC TAG, AND CONTROL METHOD THEREOF

BACKGROUND OF THE INVENTION

1. Field of the Invention

The present invention relates to a semiconductor device for passive RFID, an IC tag, and a control method of those and, particularly, to a semiconductor device and an IC tag having a voltage detector of a power supply voltage generated from radio wave, and a control method of those including a voltage detection process.

2. Description of Related Art

Recently, technology regarding radio frequency identification (RFID) attracts attention as a means of automatically recognizing a product for real-time product management in logistics at factories and product management at retail stores by attaching a tag having an IC storing product identification information to products and reading the information with a wireless antenna.

The above IC tag for RFID (hereinafter referred to as an IC tag) has no battery because it generates a power supply voltage from radio wave when communicating data with a reader/writer through radio wave. This type of IC tag is generally called "passive", in which an inner circuit of an IC tag rectifies a part of carrier wave transmitted from a reader/writer and generates a supply voltage necessary for operation. The generated supply voltage enables operation of a control logic circuit inside a semiconductor device of the IC tag, nonvolatile memory to which product identification information or the like is written, a communication circuit necessary for communicating data with a reader/writer, and so on.

FIG. 12 shows a block diagram of a conventional passive IC tag. A conventional IC tag 101 has a supply voltage generator circuit 111, a receiver circuit 112, a transmitter circuit 113, a control circuit 114, a charge pump circuit 115, an electrically erasable programmable ROM (EEPROM) 116, and an antenna 120.

The operation of the conventional IC tag of FIG. 12 is described hereinafter. A reader/writer (not shown) transmits radio wave containing a frame pulse detectable by the IC tag 101, which is a pulse having a certain frequency, to a certain area range. If the IC tag 101 is located within the detectable range of the radio wave containing a frame pulse, the IC tag 101 receives the radio wave with the antenna 120. Receiving the radio wave, the IC tag 101 rectifies the received radio wave and generates a supply voltage necessary for the internal circuit of the IC tag 101 to operate by the supply voltage generator circuit 111. Further, it generates a clock signal necessary for the internal circuit of the IC tag 101 to operate according to the frequency of the frame pulse contained in the radio wave and initializes the internal circuit in order to be prepared for receiving a write command, a read command and so on transmitted from the reader/writer.

When the IC tag 101 receives the radio wave containing a command and data transmitted from the reader/writer, the receiver circuit 112 demodulates command and data signals from the received radio wave. The control circuit 114 receives the modulated command and data and executes processing of the received command. For example, upon receiving a read command, the control circuit 114 reads data in a specified address of the EEPROM 116 and sends the read data to the transmitter circuit 113. The transmitter circuit 113 modulates the received data and transmits it through carrier wave with the antenna 120. On the other hand, upon receiving a write command, the control circuit 114 writes the received data into a specified address of the EEPROM 116. Writing to the EEPROM 116 normally requires a high voltage of about 14 to 16V. For this reason, a voltage obtained by boosting the supply voltage generated in the supply voltage generator circuit 111 with the charge pump circuit 115 is used for writing operation to the EEPROM 116.

For example, Udo Karthaus et al, "Fully Integrated Passive UHF RFID Transponder IC With 16.7-µW Minimum RF Input Power", IEEE JOURNAL OF SOLID-STATE CIRCUITS, Vol. 38, No. 10, October 2003, pp. 1602-1608 discloses a technique that generates a supply voltage from radio wave received by the antenna 120, with which the control circuit 114, the charge pump circuit 115, and the EEPROM 116 operate, and then writes wirelessly received data into the EEPROM 116.

After the write operation to the EEPROM 116 in the IC tag 101 in response to a write command from the reader/writer, it is generally checked if normal writing is executed by reading out the data written. Specifically, when the reader/writer transmits a write command, it transmits write data, a write destination address and so on and successively transmits a read command specifying the same address as the write destination address. Then, acquiring read data in response to the read command, the reader/writer compares it with the write data retained in the reader/writer. If the both data match, the reader/writer determines that normal writing has been executed and ends the write process. If, on the other hand, the two data do not match, the reader/writer determines that normal writing has failed and reexecutes the write operation.

The control circuit 114 that controls writing to and reading from the EEPROM 116 and the transmitter circuit 113 that transmits read data operate if the supply voltage generated in the supply voltage generator circuit 111 is equal to or higher than a voltage allowing a logic circuit to operate (logic circuit operation threshold voltage). However, since normal writing to the EEPROM 116 generally requires a write voltage of 14 to 16V, the supply voltage generated in the supply voltage generator circuit 111 needs to be equal to or higher than a voltage from which a write voltage can be generated by the charge pump circuit 115 (boost threshold voltage).

Since the charge pump circuit 115 is generally large, it is configured so that a voltage boost range is as small as possible. Further, since a leakage current when switching a capacitor is large, boost efficiency is low and this affects particularly boosting of a low voltage. Thus, normally, a logic circuit operation threshold voltage is lower than a boost threshold voltage.

FIG. 13 shows the relationship of a supply voltage generated from radio wave with logic circuit operation, write operation to EEPROM, and write operation of a reader/writer to an IC tag.

If a generated supply voltage is lower than a logic circuit operation threshold voltage, neither the logic circuit operation nor the write operation to EEPROM cannot be executed normally. Specifically, since a control circuit controlling writing and reading or the like does not operate in response to a write command and a following read command from the reader/writer, the IC tag cannot respond to the reader/writer. The write operation from the reader/writer to the IC tag thereby fails (the write operation is "x" in this case).

If a generated supply voltage is between a logic circuit operation threshold voltage and a boost threshold voltage, while the logic circuit can operate, normal writing to the EEPROM fails. Specifically, the IC tag operates according to commands from the reader/writer in response to a write command and a following read command. However, since normal writing to EEPROM fails, read data in response to the read command immediately after the write command is not promising; therefore, given write data≠read data, the write operation is reexecuted. Normally, the read data in this case is the data written previously. Hence, the write operation from the reader/writer to the IC tag fails (the write operation is "Δ" in this case).

If a generated supply voltage is equal to or higher than a boost threshold voltage, both the logic circuit operation and the write operation to EEPROM are executed normally. Specifically, since normal writing to EEPROM is executed in response to a write command and a following read command from the reader/writer, read data in response to the read command immediately after the write command is promising; therefore, given write data=read data, the write operation ends. Hence, the write operation from the reader/writer to the IC tag is successful (the write operation is "○" in this case).

The present invention, however, has recognized that the conventional IC tag has the following problem. When a generated supply voltage is between a logic circuit operation threshold voltage and a boost threshold voltage, the IC tag executes operation in response to the read command immediately after the write command in spite that the write operation in response to the write command from the reader/writer is not executed normally. Thus, the reader/writer cannot specify what is a cause of writing failure (write data≠read data). Specifically, it is unable to determine if the failure in data writing to the IC tag is due to shortage of supply voltage or due to another cause. For example, since the IC tag does not operate at all if a generated supply voltage is lower than a logic circuit operation threshold voltage, it is able to directly anticipate that the failure is due to shortage of supply voltage inside the IC tag. Then, it is possible to decide to change the distance between the reader/writer and the IC tag, for example. On the other hand, if a generated supply voltage is between a logic circuit operation threshold voltage and a boost threshold voltage, the IC tag responds to the read command immediately after the write command, and it is unable to determine if the failure in data writing is due to shortage of supply voltage inside the IC tag or due to other causes such as memory defect, write circuit defect, rewritable number of times limit, and aging defect. This can cause to reexecute the write operation in vain with the same conditions.

As described in the foregoing, the conventional IC tag and its control method have a problem that a reader/writer cannot determine a cause of failure of write operation to the IC tag, causing the write operation to be reexecuted in vain.

SUMMARY OF THE INVENTION

According to one embodiment of the present invention, there is provided a semiconductor device for RFID that includes a supply voltage generator circuit generating supply voltage based on a received radio signal, a voltage detector circuit detecting a reference voltage dependent on the supply voltage, a memory circuit storing data, and a control circuit determining whether it executes write operation writing data into the memory circuit according to a reference voltage detected by the voltage detector circuit. Since the semiconductor device detects generated supply voltage and determines whether it executes write operation based on the detection result, it is possible to determine if failure of the write operation is due to the shortage of the supply voltage. This can prevent vain retry of the write operation.

According to another embodiment of the present invention, there is provided an IC tag that includes an antenna receiving radio wave from a reader/writer, and a semiconductor device for passive RFID connected to the antenna. The semiconductor device for passive RFID has a supply voltage generator circuit generating supply voltage based on a radio signal received from the reader/writer, a voltage detector circuit detecting a reference voltage dependent on the supply voltage, a memory circuit storing data, and a control circuit determining whether it executes write operation writing data into the memory circuit according to a reference voltage detected by the voltage detector circuit. Since the IC tag detects generated supply voltage and determines whether it executes write operation based on the detection result, it is possible to determine if failure of the write operation is due to the shortage of the supply voltage. This can prevent vain retry of the write operation.

According to yet another embodiment of the present invention, there is provided an control method of controlling writing in an IC tag having a memory circuit storing data. The method includes generating supply voltage based on a radio signal received from a reader/writer, detecting a reference voltage dependent on the supply voltage, determining whether it executes executing write operation writing data into the memory circuit according to a detected reference voltage, and executing a verify process of the write operation. Since the control method detects generated supply voltage and determines whether it executes write operation based on the detection result, it is possible to determine if failure of the write operation is due to the shortage of the supply voltage. This can prevent vain retry of the write operation.

The semiconductor device according to the present invention can clarify a cause of failure of write operation from a reader writer to an IC tag, thereby preventing vain retry of the writing process.

BRIEF DESCRIPTION OF THE DRAWINGS

The above and other objects, advantages and features of the present invention will be more apparent from the following description taken in conjunction with the accompanying drawings, in which:

FIG. 13 is a view showing the relationship between a supply voltage and operation in a conventional IC tag.

DESCRIPTION OF THE PREFERRED EMBODIMENTS

First Embodiment

Figure 1:
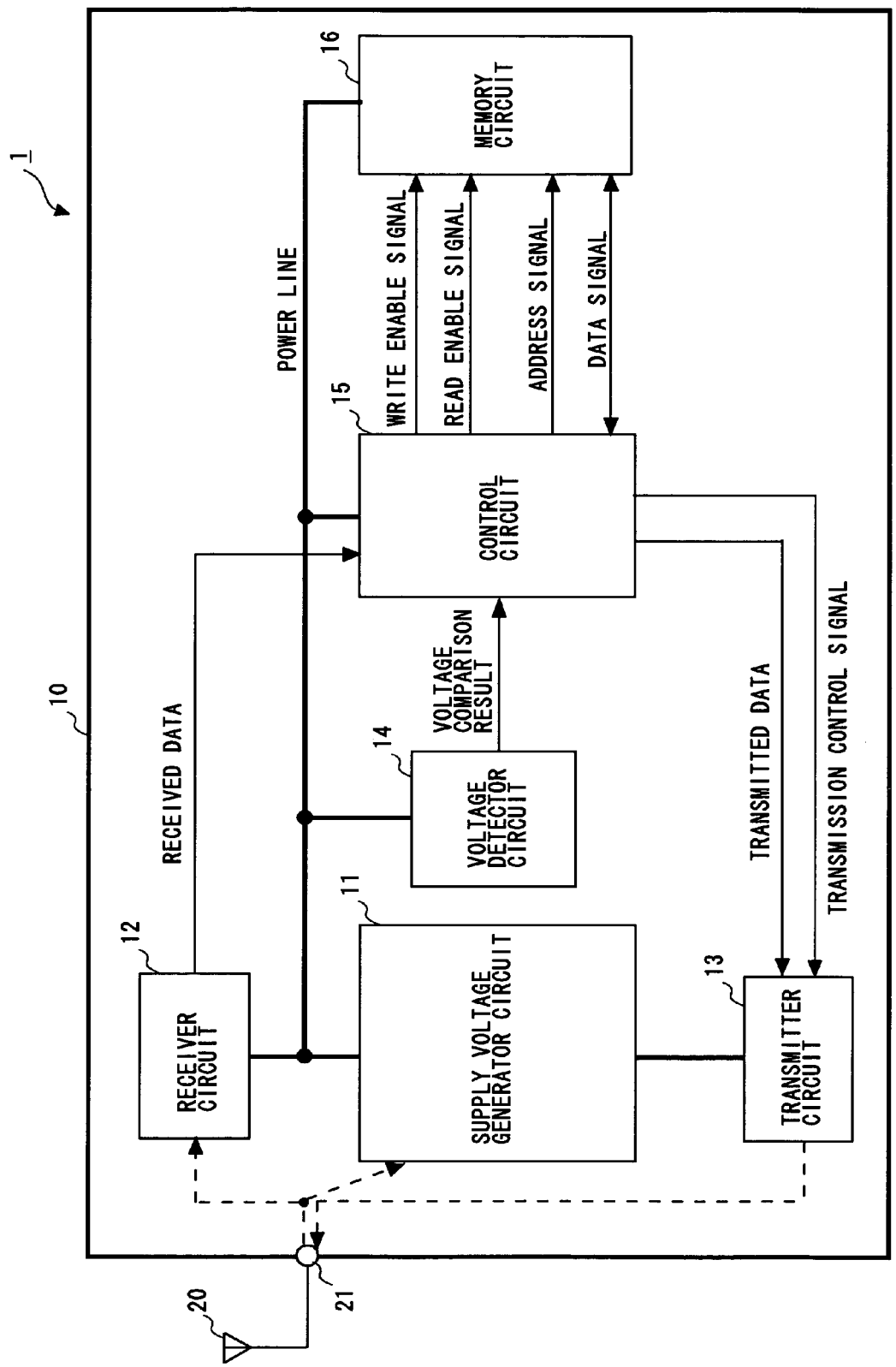
FIG. 1 is a block diagram showing the configuration of an IC tag of the invention.

An IC tag and its write operation according to a first embodiment of the invention are described hereinafter with reference to FIGS. 1 to 9. FIG. 1 is a simplified block diagram of the IC tag of the invention. The IC tag 1 has a semiconductor device 10 and an antenna 20 that transmits and receives radio wave containing data. The semiconductor device 10 has an antenna terminal 21 that is connected to the antenna 20, a supply voltage generator circuit 11 that rectifies radio wave and generates a power supply voltage, the receiver circuit 12 that demodulates data from received radio wave, a transmitter circuit 13 that modulates data and performs radio transmission, a voltage detector circuit 14 that detects the supply voltage generated in the supply voltage generator circuit 11, a control circuit 15 that performs control of a memory circuit 16 and processing of transmitted or received data, and the memory circuit 16.

Figure 2:
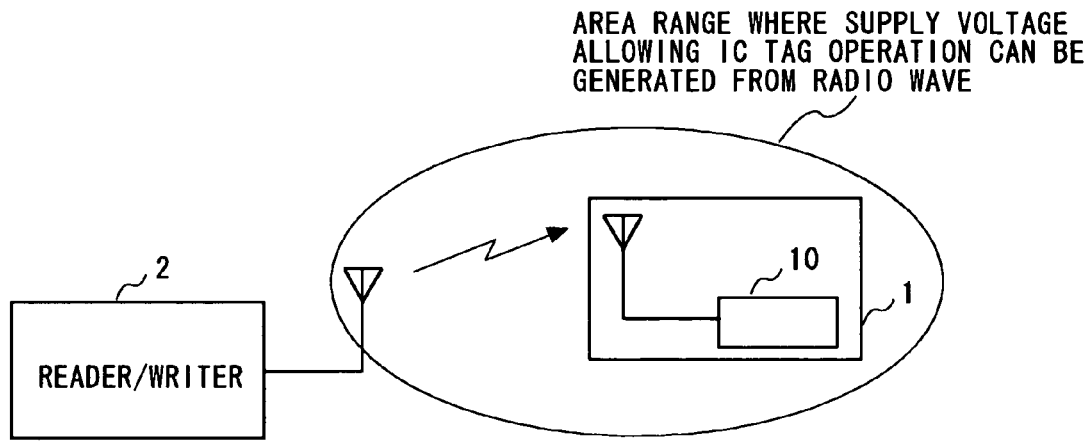
FIG. 2 is a diagram of an IC tag system of the invention.

A supply voltage necessary for the IC tag 1 of the invention to operate is described below. FIG. 2 shows the distance between a reader/writer 2 and the IC tag 1 according to this invention. Since the IC tag 1 of the invention is a passive type with no battery, it is necessary to rectify radio wave transmitted from the reader/writer 2 and generate a supply voltage in the supply voltage generator circuit 11. The level of the voltage which can be generated in the supply voltage generator circuit 11 normally depends on the distance between the reader/writer 2 and the IC tag 1. Thus, as shown in FIG. 2, the IC tag 1 needs to be located within the distance range where a supply voltage allowing the semiconductor device 10 in the IC tag 1 to operate can be generated by receiving radio wave transmitted from the reader/writer 2.

Since the control circuit 15 is constituted by a logic circuit, it can operate normally if a supply voltage generated in the supply voltage generator circuit 11 is equal to or higher than a minimum supply voltage allowing the logic circuit to operate, which is referred to hereinafter as a logic circuit operation threshold voltage. Therefore, if a supply voltage is lower than the logic circuit operation threshold voltage, the IC tag 1 cannot receive data from the reader/writer 2, transmit data to the reader/writer 2, nor execute writing to or reading from an internal memory area (a memory area 52 described later).

Importantly, a voltage required for write operation to the memory area 52 is different from a voltage required for reading operation from the memory area 52. A possible memory area 52 of the present invention is nonvolatile memory such as EEPROM. A voltage required for writing to nonvolatile memory is normally higher than a voltage required for reading, which is about the same as a logic circuit operation threshold voltage. Normal write operation fails unless the write voltage is a required value or higher. Therefore, the memory circuit 16 of the present invention has a charge pump circuit (a charge pump circuit 51 described later) that boosts a generated supply voltage so as to produce a voltage required for writing. Still, a minimum supply voltage for boosting a voltage to a write voltage value, which is referred to hereinafter as a boost threshold voltage, is required as described above. Therefore, though reading operation from the memory circuit 16 can be executed normally if a generated supply voltage is a logic circuit operation threshold voltage or higher, write operation to the memory circuit 16 cannot be executed normally unless a generated supply voltage is a boost threshold voltage or higher, even if it is a logic circuit operation threshold voltage or higher.

Figure 3:
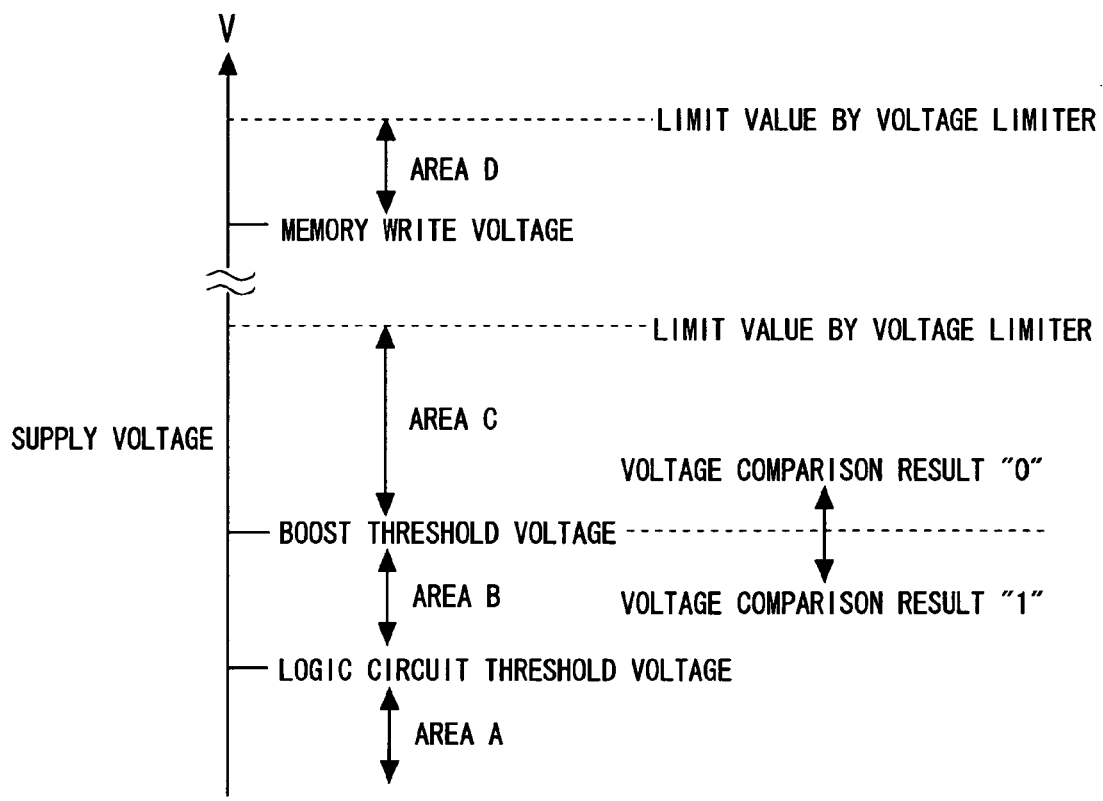
FIG. 3 is a view showing the level of a supply voltage of an IC tag of the invention.

FIG. 3 describes the relationship of a generated supply voltage and a voltage allowing the IC tag 1 to operate. FIG. 3 shows a logic circuit operation threshold voltage, a boost threshold voltage, and a boosted voltage required for writing to the memory area 52, which is referred to hereinafter as a memory write voltage, and defines ranges between the voltages as areas A to D.

In the area A, a generated supply voltage is lower than a logic circuit operation threshold voltage, and therefore the control circuit 15 in the IC tag 1 cannot operate. Thus, the IC tag 1 does not operate at all in response to a command from the reader/writer 2.

In the area B, a generated supply voltage is between a logic circuit operation threshold voltage and a boost threshold voltage. Thus, though the control circuit 15 in the IC tag 1 operates, write operation in response to a write command cannot be executed normally. Therefore, while the IC tag 1 executes writing and reading operation in response to a write command and a following read command from the reader/writer 2, given a result of write data≠read data, the reader/writer 2 determines that the write operation is not executed normally and transmits a write command again. The IC tag 1 therefore cannot execute writing normally.

In the area C, a generated supply voltage is a boost threshold voltage or higher, and the charge pump circuit 51 can boost the voltage to a voltage value required for writing to the memory area 52. Thus, the IC tag 1 can execute writing normally in response to a command from the reader/writer 2.

In the area D is a boosted voltage from a supply voltage generated in the supply voltage generator circuit 11. If the generated supply voltage is in the area C, the boosted supply voltage falls within the area D, thus having a normal write voltage. The IC tag 1 can thereby execute writing normally.

A limit value by a voltage limiter shown in FIG. 3 indicates a withstand voltage of a transistor constituting a circuit. Particularly, since a transistor of the charge pump circuit 51 is compatible with a high withstand voltage in the area D, the limit value by the voltage limiter is high.

The circuit configuration of FIG. 1 is described below. The supply voltage generator circuit 11 generates a supply voltage necessary for an internal circuit of the semiconductor device 10 to operate as described above and supplies the voltage to the receiver circuit 12, the transmitter circuit 13, the voltage detector circuit 14, the control circuit 15, and the memory circuit 16.

The receiver circuit 12 and the transmitter circuit 13 respectively modulate and demodulate data for communication with the reader/writer 2.

The voltage detector circuit 14 determines if a generated supply voltage is a boost threshold voltage or higher and outputs the result as a voltage comparison result to the control circuit 15. For example, an inverter whose threshold is a boost threshold voltage may be used as the voltage detector circuit 14. The threshold of the inverter needs to be designed to equal a boost threshold voltage. The inverter receives a supply voltage generated in the supply voltage generator circuit 11. If the input voltage is lower than a boost threshold voltage, the inverter outputs "1". If, on the other hand, the input voltage is a boost threshold voltage or higher, the output of the inverter is inverted to "0". The voltage detector circuit 14 outputs the output of the inverter as a voltage comparison result to the control circuit 15.

Figure 4:
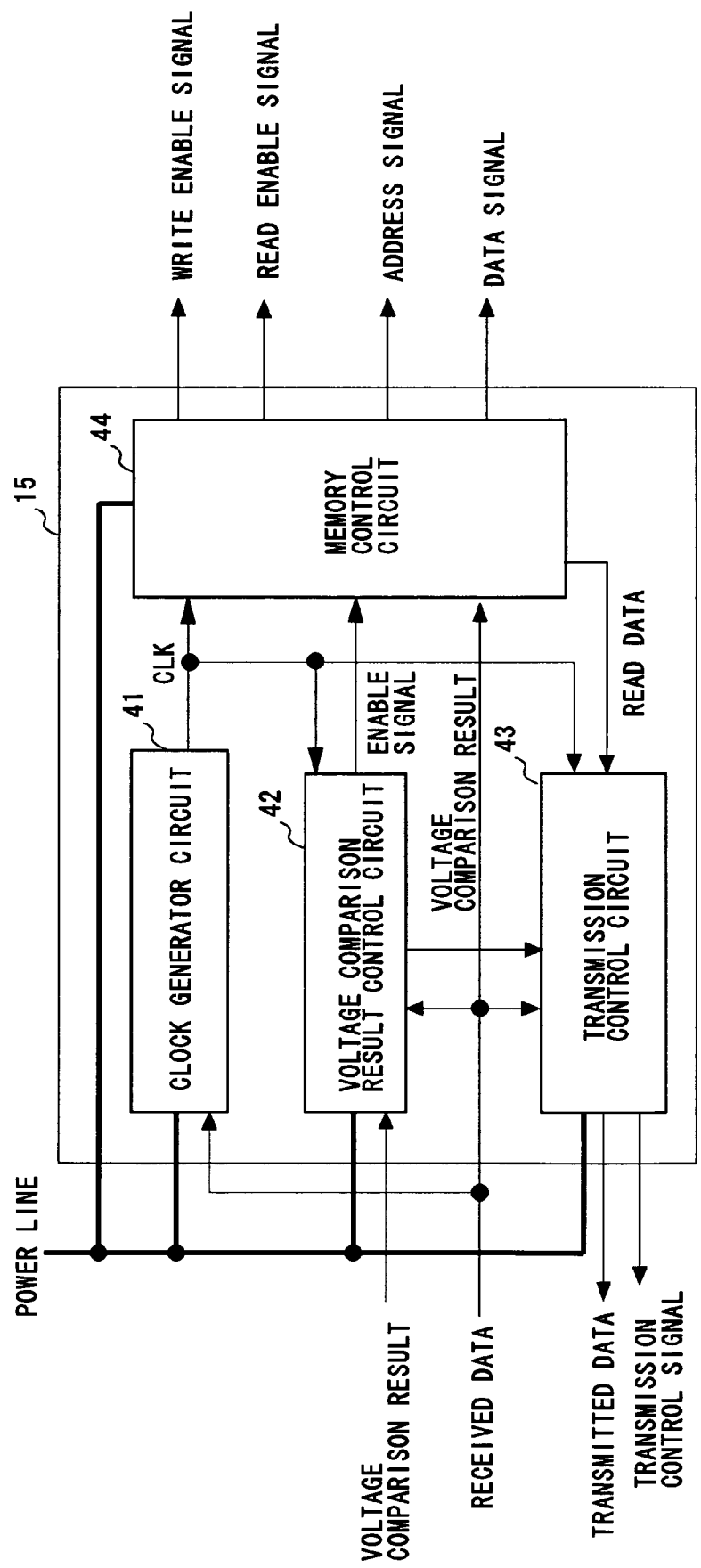
FIG. 4 is a block diagram showing the configuration of a control circuit used in an IC tag of the invention.

FIG. 4 is a block diagram showing the configuration of the control circuit 15 used in the IC tag 1 of the invention. The control circuit 15 has a clock generator circuit 41, a voltage comparison result control circuit 42, a transmission control circuit 43, and a memory control circuit 44.

The clock generator circuit 41 generates a clock based on a frame pulse having a certain frequency which is contained in the radio wave transmitted from the reader/writer 2, and supplies the generated clock to another circuit such as the memory control circuit 44.

The voltage comparison result control circuit 42 stores the voltage comparison result from the voltage detector circuit 14 into an internal register. It also determines if a command transmitted from the reader/writer 2 is a write command or not, and if it is a write command, outputs an enable signal to the memory control circuit 44 according to the voltage comparison result stored in the register. Specifically, if it is a write command and the voltage comparison result is "0", normal writing is possible and the enable signal is activated. On the other hand, if it is a write command and the voltage comparison result is "1", normal writing is impossible and the enable signal is inactivated. If it is a read command for the memory circuit 16, the enable signal is activated regardless of the voltage comparison result; however, if it is a read command for verification of write operation, the enable signal is activated or inactivated according to the voltage comparison result.

The transmission control circuit 43 controls transmission data and a transmission control signal necessary for transmitting read data in response to a read command from the reader/writer 2 and the voltage comparison result stored in the internal register of the voltage comparison result control circuit 42.

The memory control circuit 44 receives a command, address and data transmitted from the reader/writer 2 and controls writing to or reading from the memory area 52 in the memory circuit 16. The writing or reading is executed only when the enable signal output from the voltage comparison result control circuit 42 is activated. The data read out in response to the read command is output to the transmission control circuit 43.

Figure 5:
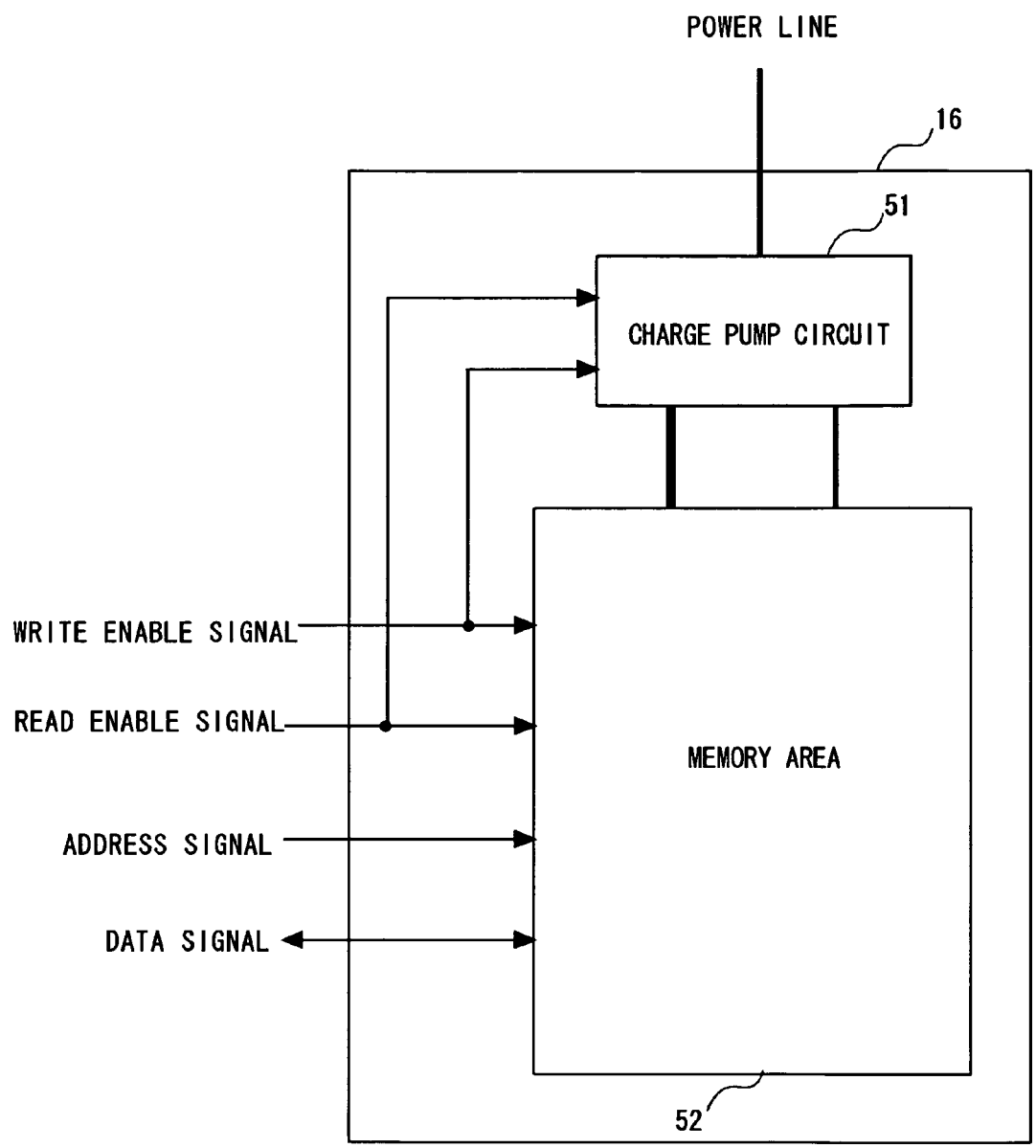
FIG. 5 is a block diagram showing the configuration of a memory circuit used in an IC tag of the invention.

FIG. 5 is a block diagram showing the configuration of the memory circuit 16 used in the IC tag 1 of the present invention. The memory circuit 16 has a charge pump circuit 51 and a memory area 52. The charge pump circuit 51 boosts the supply voltage generated in the supply voltage generator circuit 11 up to a voltage required for writing to the memory area 52. Data is written to the memory area 52 according to a control signal output from the control circuit 15 by using a write voltage boosted by the charge pump circuit 51. On the other hand, data is read from the memory area 52 by using the supply voltage generated in the supply voltage generator circuit 11 as it is. Switching of voltages is controlled according to a write enable signal and a read enable signal.

Figure 6:
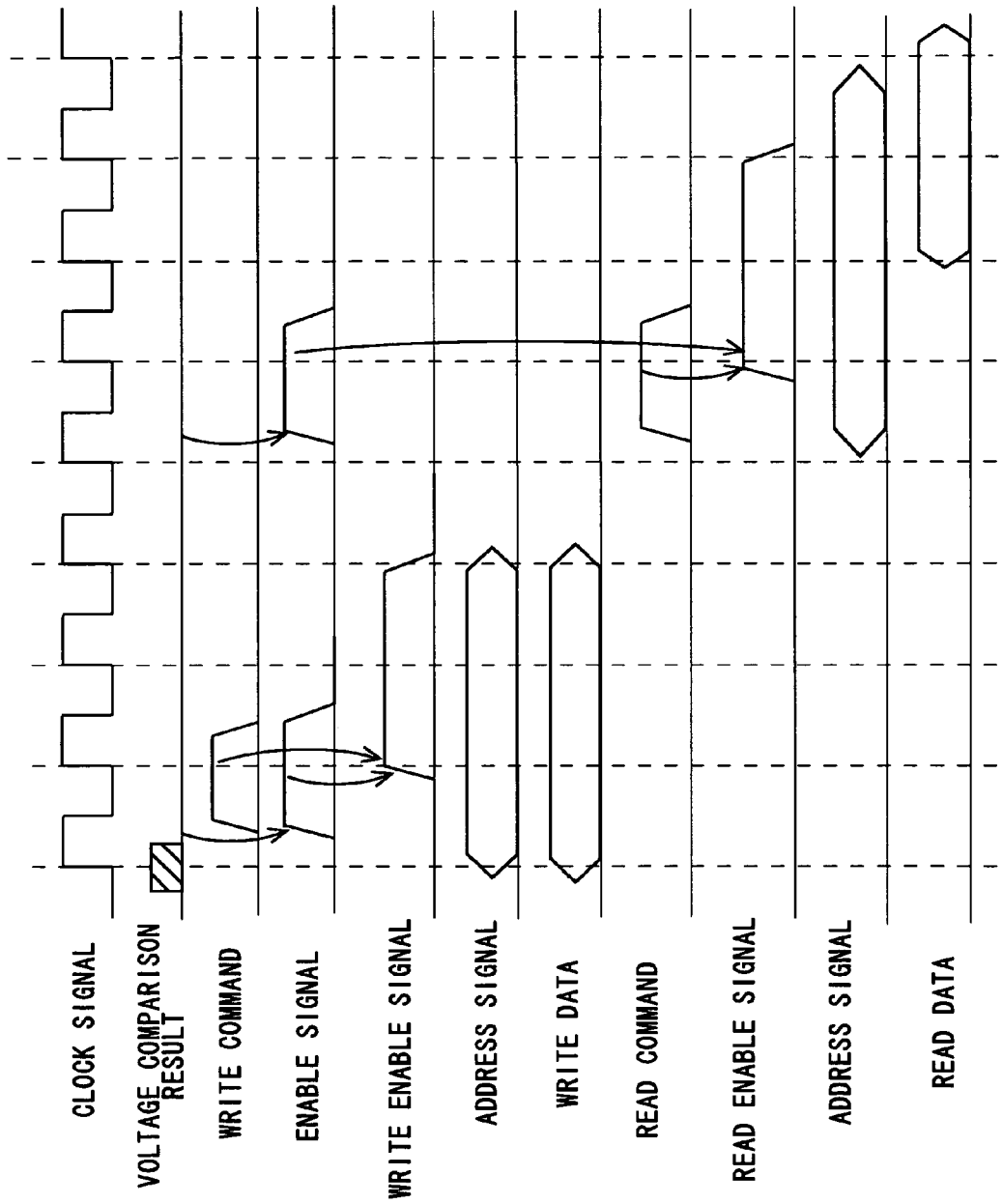
FIG. 6 is a timing chart showing the operation of an IC tag of the invention.
Figure 7:
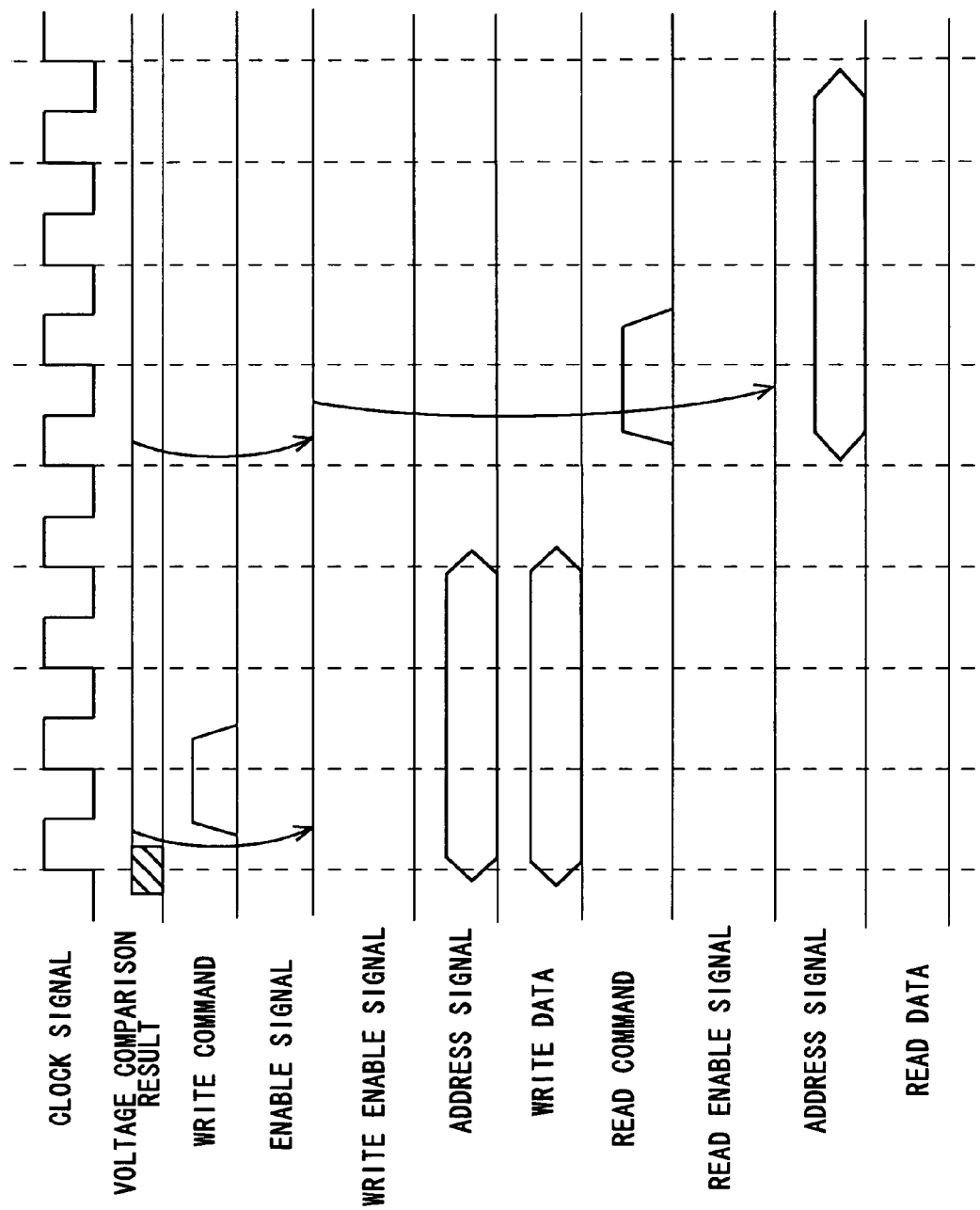
FIG. 7 is a timing chart showing the operation of an IC tag of the invention.

FIGS. 6 and 7 are the timing charts showing the operation of the semiconductor device 10 in the IC tag 1 during write operation from the reader/writer 2 to the IC tag 1. The timing charts mainly describe the operation of the voltage detector circuit 14, the control circuit 15 and the memory circuit 16. FIG. 6 shows the case where the writing ends normally and FIG. 7 shows the case where the writing does not end normally.

FIG. 6 is an operation timing chart when a supply voltage that allows normal writing to the memory area 52 is generated (supply voltage>boost threshold voltage) for write operation by the reader/writer 2. Receiving radio wave transmitted from the reader/writer 2, the supply voltage generator circuit 11 generates a supply voltage, and the voltage detector circuit 14 determines if the generated supply voltage is a boost threshold voltage or higher. Since the supply voltage is higher than the boost threshold voltage in the case of FIG. 6, the voltage detector circuit 14 outputs "0" as a voltage comparison result. Receiving the voltage comparison result, the voltage comparison result control circuit 42 stores it into an internal register. After a certain time period, the semiconductor device 10 receives a write command from the reader/writer 2. If the voltage comparison result control circuit 42 determines that the received command is a write command, it reads out the voltage comparison result "0" stored in the register and activates an enable signal to allow write operation into the memory circuit 16.

The memory control circuit 44 generates a write enable signal required for writing data into the memory area 52 and executes write operation according to write data and an address specified by the reader/writer 2. Further, after a certain time period, the semiconductor device 10 receives a read command from the reader/writer 2. Since the read command specifies the same address as the previous write command, the voltage comparison result control circuit 42 determines that it is a read command for verifying the previous write operation. It then reads out the voltage comparison result "0" stored in the register and activates the enable signal to allow read operation from the memory circuit 16. The memory control circuit 44 generates a read enable signal required for reading data from the memory area 52 and reads data from the address specified by the reader/writer 2. The read data read out by the memory control circuit 44 is transmitted to the reader/writer 2 from the transmitter circuit 13 through the transmission control circuit 43.

FIG. 7 is an operation timing chart when a supply voltage that allows normal writing to the memory area 52 is not generated (supply voltage<boost threshold voltage) for write operation by the reader/writer 2. Since the generated supply voltage is lower than a boost threshold voltage, the voltage detector circuit 14 outputs "1". Receiving the voltage comparison result "1", the voltage comparison result control circuit 42 inactivates the enable signal. Therefore, the memory control circuit 44 does not execute any operation in response to a write command and a following read command from the reader/writer 2.

Figure 8:
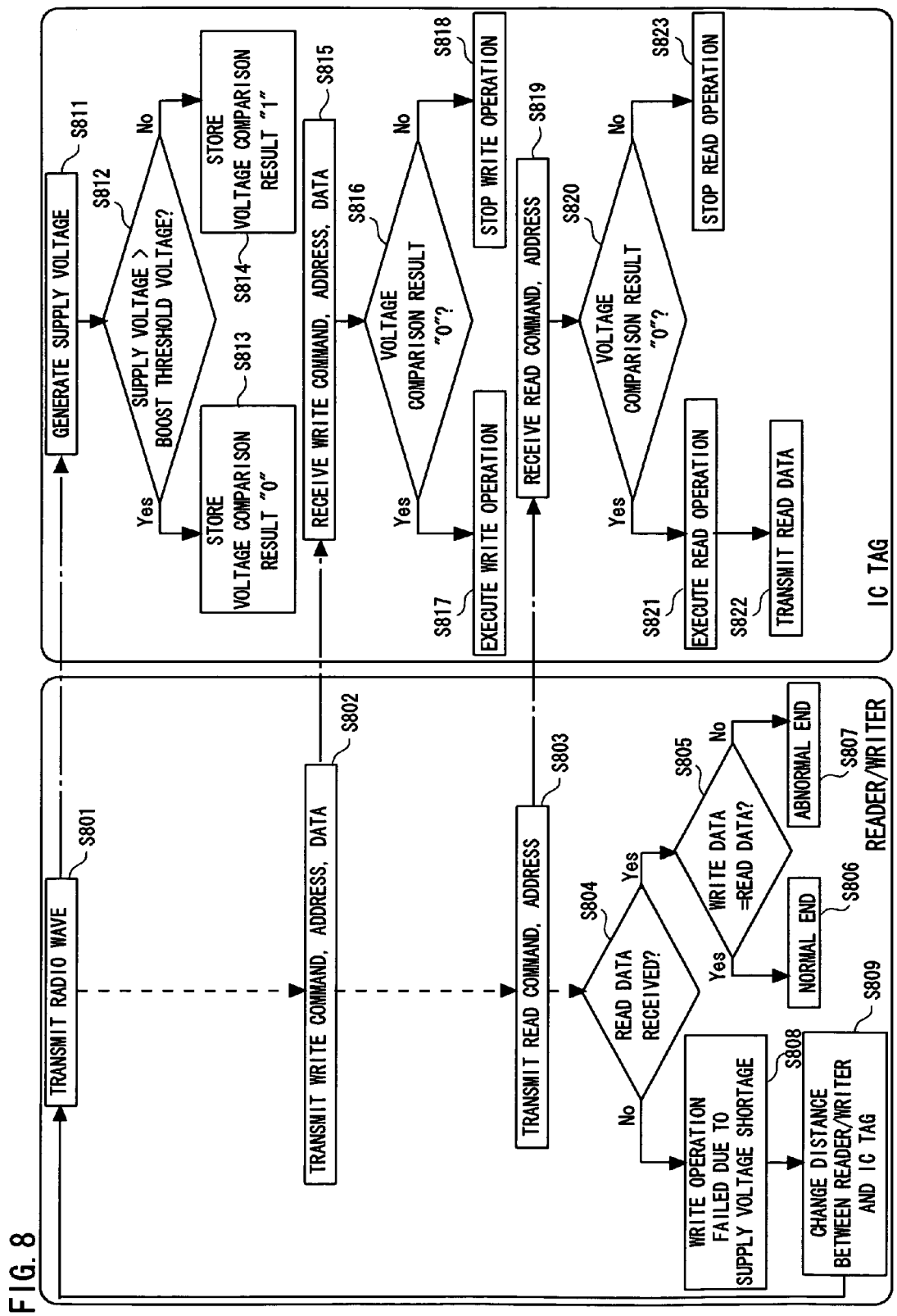
FIG. 8 is a flowchart showing a writing process to an IC tag of the invention.

A series of operation when writing data from the reader/writer 2 to the IC tag 1 is described below. FIG. 8 is a flowchart showing write operation from the reader/writer 2 to the IC tag 1. When the reader/writer 2 writes data to the IC tag 1, it transmits radio wave containing a frame pulse only (S801), transmits a write command, a write destination address, and write data (S802), and transmits a read command and a read destination address (S803). After transmitting the read command, the write data and the read data are compared to determine if normal writing is executed normally. Since the reader/writer 2 executes the transmission in a certain time interval, if it does not receive read data form the IC tag 1 after a certain period of time, it determines that the write operation has failed and reexecutes the write operation. The process is described hereinafter in further detail with reference to the flowchart.

Receiving radio wave containing only a frame pulse transmitted from the reader/writer 2, the IC tag 1 generates a supply voltage, initializes an internal circuit, and generates a clock signal (S811). After generating a supply voltage from the radio wave, the IC tag 1 determines if the generated supply voltage is equal to or higher than a boost threshold voltage (S812). If the generated supply voltage is a boost threshold voltage or higher, it stores "0" as a voltage comparison result into a register (S813); on the other hand, if the generated supply voltage is less than the boost threshold voltage, it stores "1" as a voltage comparison result into the register (S814).

After a certain time period, the IC tag 1 receives a write command, a write destination address and write data from the reader/writer 2 (S815) and verifies the voltage comparison result stored in the register (S816). If the voltage comparison result is "0", the IC tag 1 executes write operation (S817); if the voltage comparison result is "1", it stops write operation (S818).

Further, after a certain time period, verification of the write operation is performed. For example, the IC tag 1 receives a read command and a read destination address from the reader/writer 2 (S819) and obtains the voltage comparison result stored in the register (S820). If the voltage comparison result is "0", the IC tag 1 executes read operation (S821) and transmits read data to the reader/writer 2 (822). On the other hand, if the voltage comparison result is "1", it stops read operation (S823) and does not transmit any data.

If the reader/writer 2 receives read data from the IC tag 1 in a certain time period after transmitting a read command, it checks if the write data and the read data match (S805). If the write data equals the read data, it is determined that the write operation has been executed normally and the process ends (S806). On the other hand, if the write data does not equal the read data, it can be determined that the write operation has failed in spite that the generated supply voltage is a boost threshold voltage or higher, and the write operation has possibly failed due to a cause different from shortage of supply voltage. Therefore, the write process ends as an abnormal end (S807).

If the reader/writer 2 does not receive read data from the IC tag 1 in a certain time period after transmitting a read command, it is determined that the processing in the IC tag 1 is not executed due to shortage of supply voltage (S808). Then, after taking some measures such as changing the distance between the reader/writer 2 and the IC tag 1 (S809), the write operation is reexecuted.

In a conventional technique, the control circuit 15 in the IC tag 1 operates in response to a write command and a following read command in spite of supply voltage shortage, and it is thus impossible to attribute a cause to the supply voltage shortage. On the other hand, the IC tag 1 of the present invention does not operate at all in the event of supply voltage shortage, and it is thereby possible to attribute a cause to the supply voltage shortage. Therefore, if no transmission data is sent from the IC tag 1, it is possible to take measures for eliminating the supply voltage shortage by reducing the distance between the reader/writer 2 and the IC tag 1, for example. This can avoid another failure due to the same cause from occurring.

Second Embodiment

Figure 9:
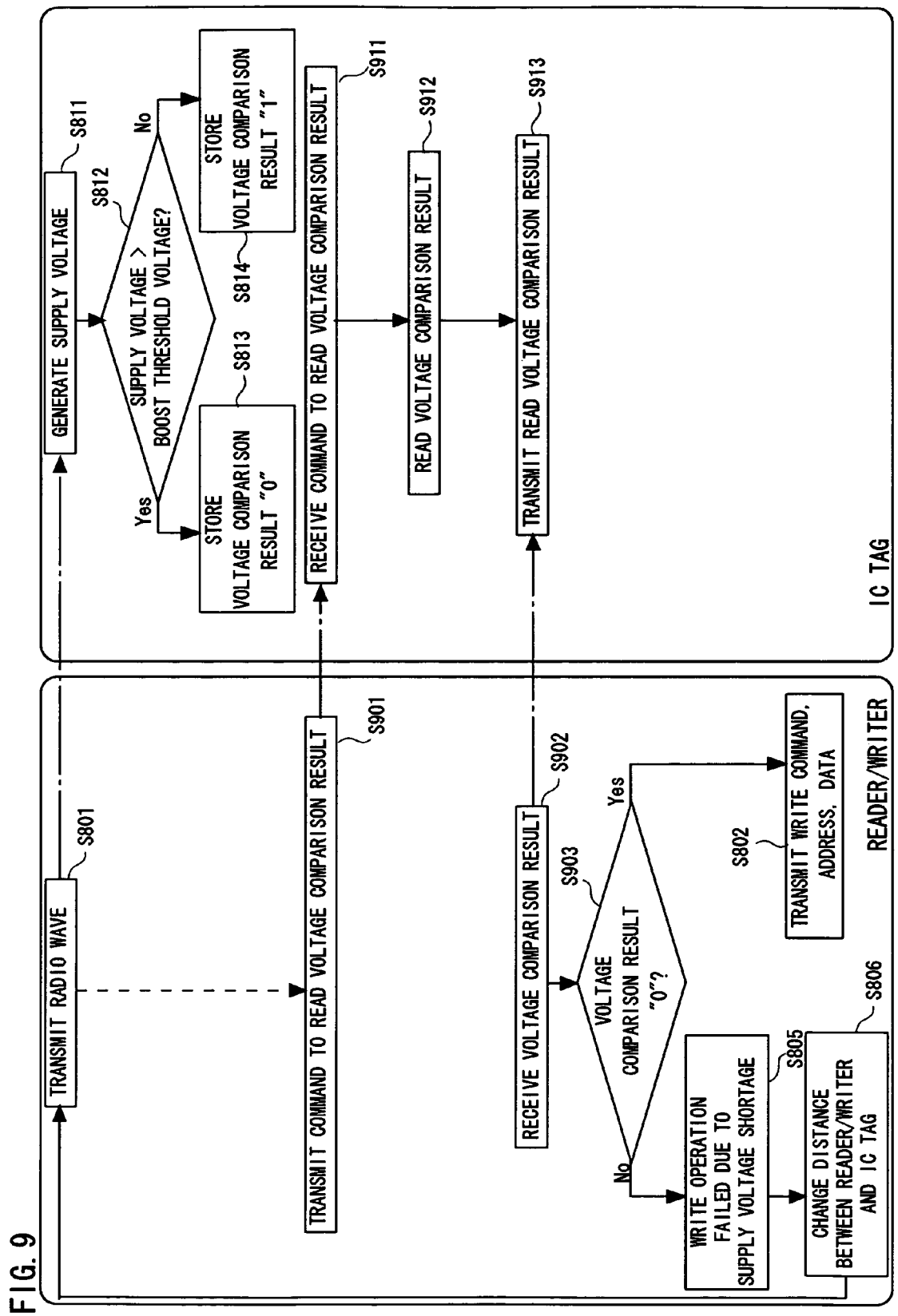
FIG. 9 is a flowchart showing a writing process to an IC tag of the invention.
Figure 10:
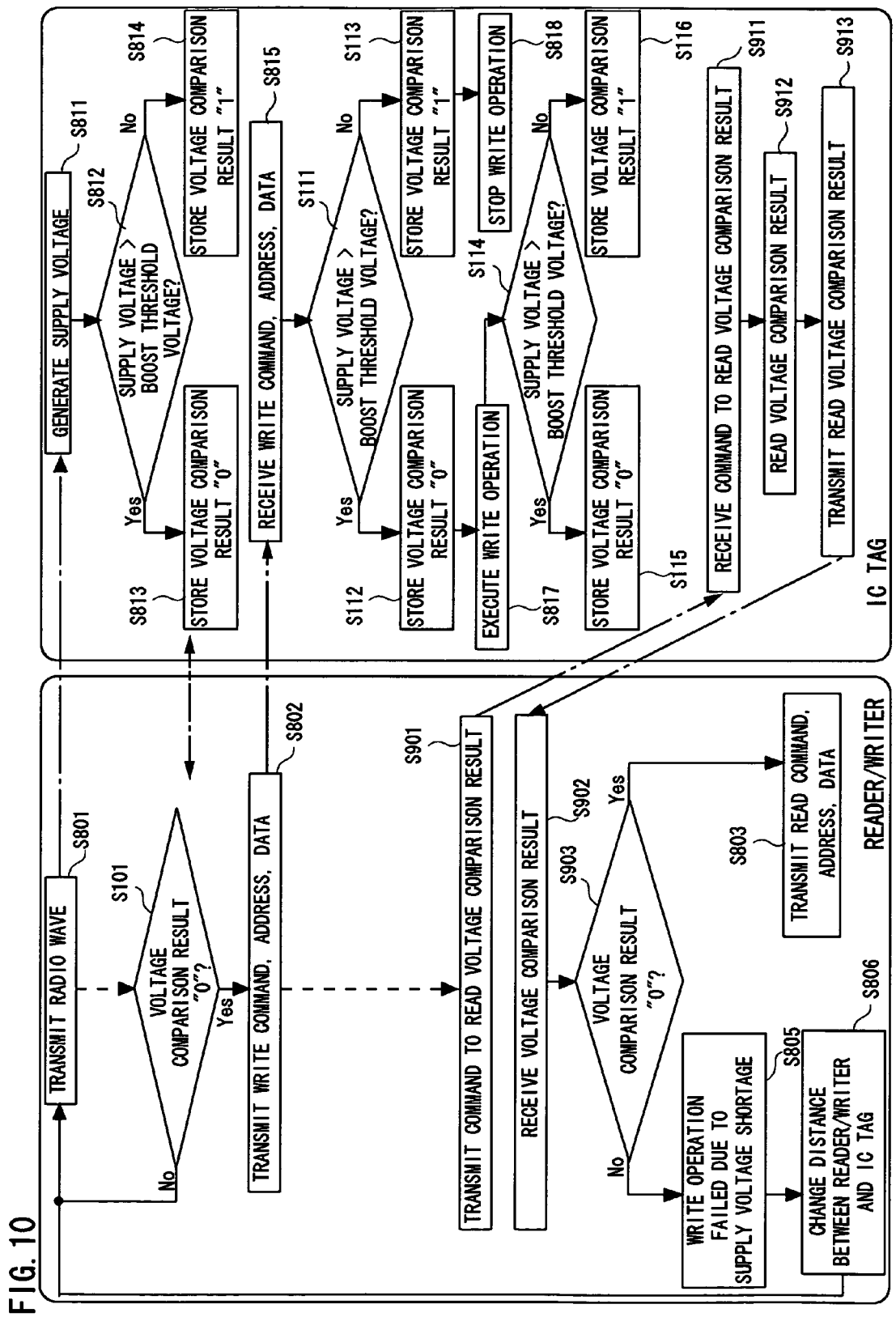
FIG. 10 is a flowchart showing a writing process to an IC tag of the invention.

Write operation in an IC tag according to a second embodiment of the invention is described hereinafter with reference to FIGS. 9 and 10. Like FIG. 8, FIGS. 9 and 10 are flowcharts of write operation from the reader/writer 2 to the IC tag 1.

In the flowchart of FIG. 8 described above, if the voltage comparison result detected after generating a supply voltage is "1", the IC tag 1 does not respond to a write command and a read command. However, since the reader/writer 2 is not informed of the situation, even if the voltage comparison result is "1", it transmits a write command and a read command. On the other hand, this embodiment transmits a write command only when the voltage comparison result is "0" as shown in the flowchart of FIG. 9. In FIG. 9, the steps S801, S802, S805, S806, and S811 to S814 are the same as in FIG. 8.

A verify process of write operation may be performed before transmission of a write command or execution of write operation. For example, as shown in the FIG. 9, the reader/writer 2 transmits a command to read out a voltage comparison result to the IC tag 1 before transmitting a write command (S901). The IC tag 1 receives the command to read out a voltage comparison result (S911), reads out the voltage comparison result stored in the register (S912), and transmits it to the reader/writer 2 (S913). The reader/writer 2 receives the voltage comparison result (S902) and determines if the voltage comparison result is "0" (S903).

If the voltage comparison result is "0", the reader/writer 2 determines that a supply voltage is equal to or higher than a boost threshold voltage which enables normal writing, and therefore transmits a write command, a write destination address, and write data to the IC tag 1 (S802). On the other hand, if the voltage comparison result is "1", it determines that a supply voltage is not equal to or higher than a boost threshold voltage and it is unable to execute normal writing due to shortage of supply voltage (S805). Since it is required in this case to increase the supply voltage generated in the supply voltage generator circuit 11, measures such as changing the distance between the reader/writer 2 and the IC tag 1 are taken (S806), and the reader/writer 2 again transmits radio wave which does not contain data before transmitting a write command (S801). This operational flow prevents transmission of a write command in vain when a supply voltage is insufficient. After changing the distance between the reader/writer 2 and the IC tag 1, a writing process may be reexecuted.

Further, since the IC tag 1 generates a supply voltage from radio wave, a generated supply voltage can be easily affected by a change in the environment surrounding the reader/writer 2 and the IC tag 1. Therefore, even if the supply voltage generated prior to transmitting a write command is a boost threshold voltage or higher, it can happen that the supply voltage changes by the time of write operation to the memory area 52 to fall below the boost threshold voltage when actually executing the write operation. Thus, as shown in the flowchart of FIG. 10, a supply voltage may be detected in other timing. In FIG. 10, the steps S801, S802, S803, S805, S806, S811 to S815, S817, and S818 are the same as in FIG. 8, and the steps S901 to S903 and S911 to S913 are the same as in FIG. 9.

The operational flow of FIG. 10 determines if a generated supply voltage is equal to or higher than a boost threshold voltage before actually executing write operation after receiving a write command in the IC tag 1 (S111). The write operation is executed only when the supply voltage comparison result is "0" (S817).

It can also happen that a supply voltage drops during write operation even if the supply voltage comparison result is "0" immediately before the write operation. Thus, the operational flow of FIG. 10 determines if the supply voltage is equal to or higher than a boost threshold voltage after completing the write operation (S114). If the supply voltage is less than the boost threshold voltage, it is highly possible that the write operation has not been executed normally. Therefore, in this case, the voltage comparison result "1" is stored in the register (S116) and no operation is executed in response to a read command received after that (for example, S823 of FIG. 8).

If the voltage comparison result before and after the write operation described above is "1", a read command transmitted from the reader/writer 2 immediately after that is in vein. Thus, if the flow of FIG. 10 also reads out the voltage comparison result just like the flow of FIG. 9 (S901 S902), it is possible to prevent a read command from being transmitted in vain after that.

By combining the supply voltage comparison before write operation, the supply voltage comparison after write operation, and the readout of a voltage comparison result, it is possible to achieve highly reliable and high speed write operation.

Other Embodiments

Figure 11:
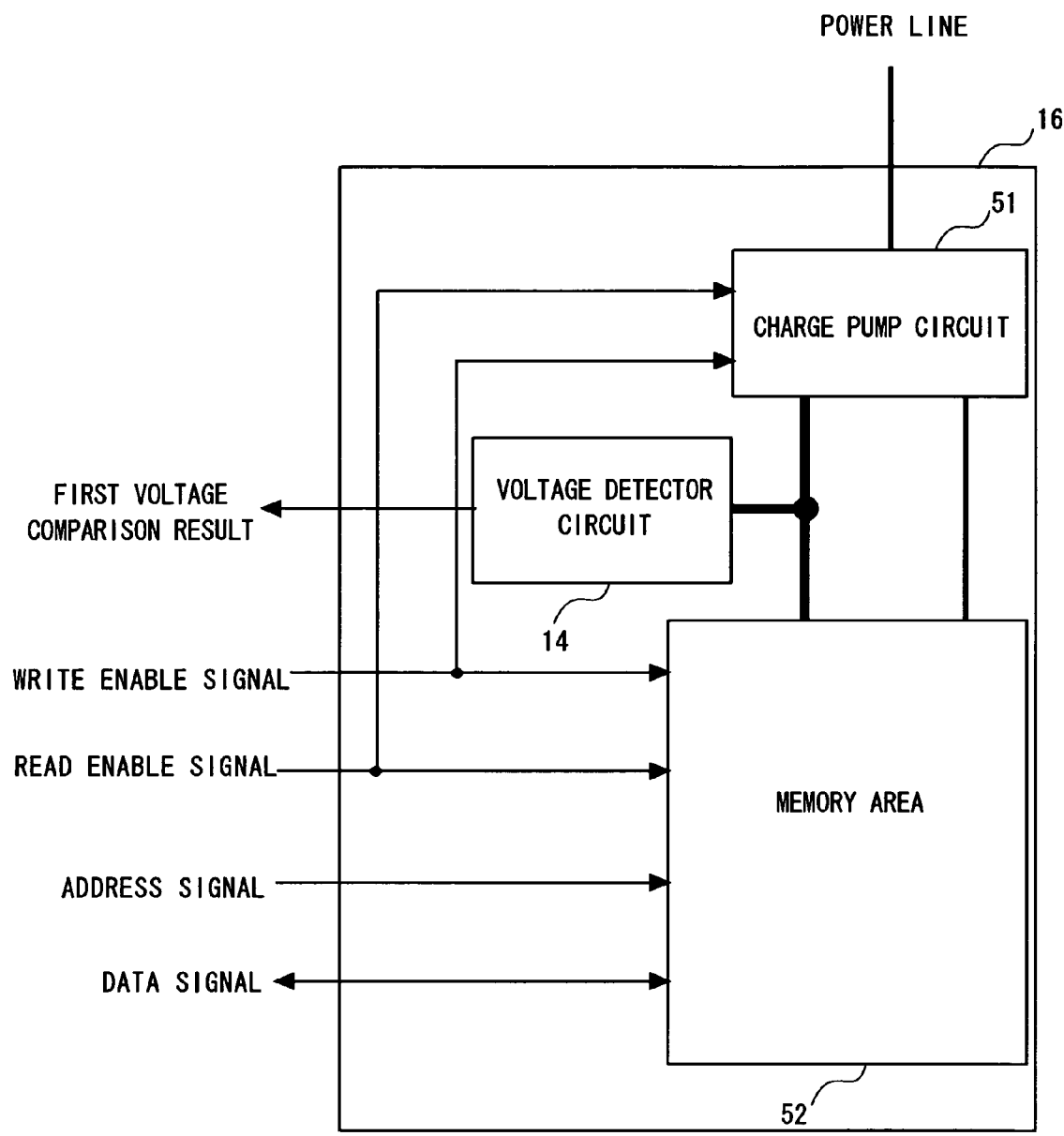
FIG. 11 is a block diagram showing the configuration of a memory circuit used in an IC tag of the invention.
Figure 12:
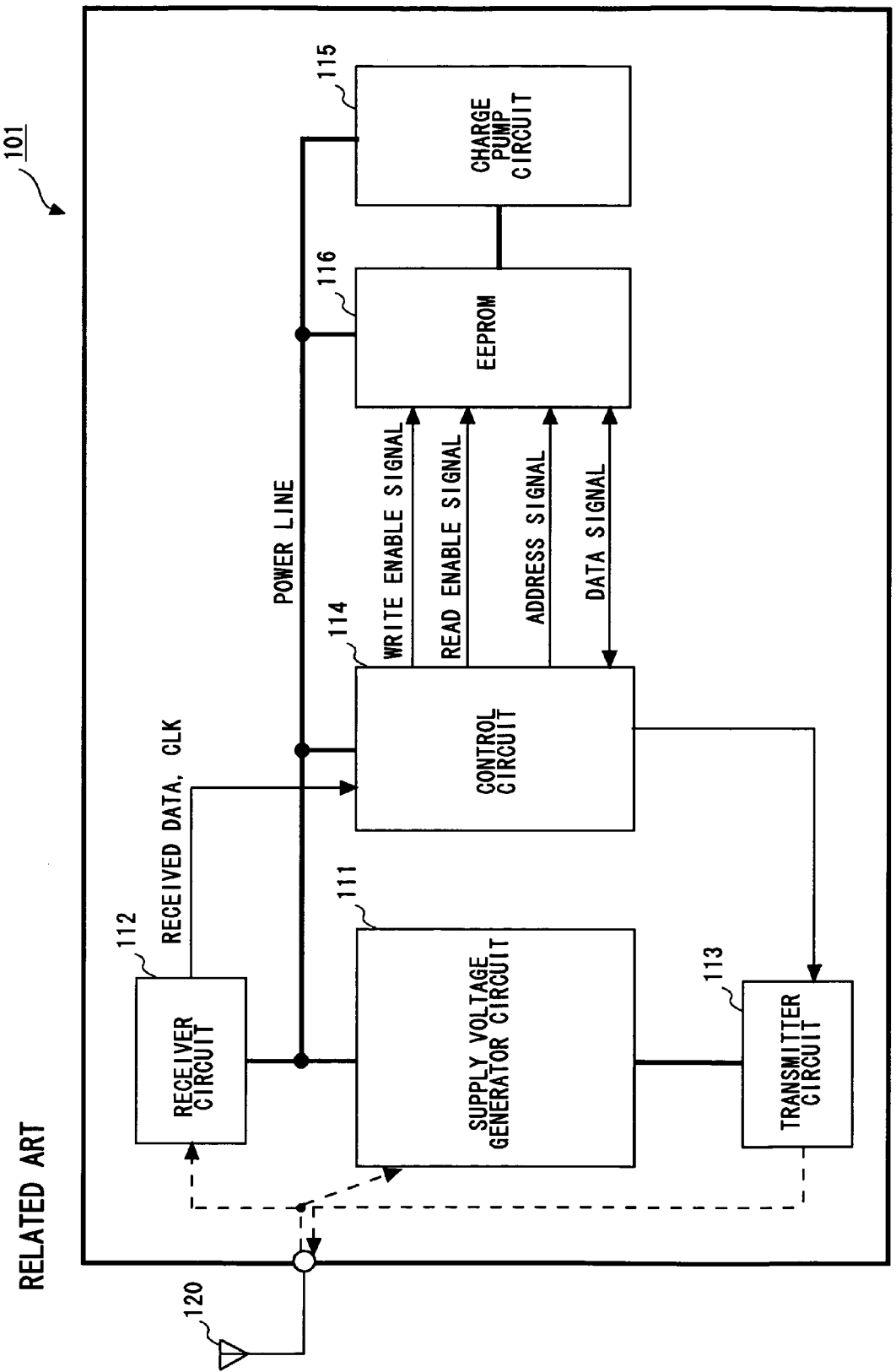
FIG. 12 is a block diagram showing the configuration of a conventional IC tag.

FIG. 11 shows a voltage detector circuit of another embodiment. The voltage detector circuit 14 described in FIG. 1 compares a supply voltage generated in the supply voltage generator circuit 11 with a boost threshold voltage; on the other hand, the voltage detector circuit 14 of FIG. 11 compares a supply voltage boosted in the charge pump circuit 51 with a minimum voltage required for writing to the memory circuit 16. It is thereby possible to directly check if the write voltage required when writing data to the memory circuit 16 is actually generated or not, which enables more accurate determination.

The memory area according to the present invention may be applied to a circuit where a voltage necessary for writing is equal to or higher than a voltage necessary for a control circuit to operate, such as nonvolatile memory including EEPROM, flash memory, Ferroelectric RAM (FeRAM), Magnetic RAM (MRAM), and Ovonic Unified Memory (OUM).

It is apparent that the present invention is not limited to the above embodiment that may be modified and changed without departing from the scope and spirit of the invention.

What is claimed is:

1. A semiconductor device for a tag included in a communication system, the communication system including the tag and a reader/writer communicating by a radio signal with the tag, the communication system executing a verify process that the reader/writer reads from the tag a write data to determine whether a write operation is correct or not after the reader/writer writes in the tag the write data, the semiconductor device comprising:
    a supply voltage generator responsive to the radio signal, to generate a supply voltage therefrom;
    a control unit being operable on the supply voltage of a first voltage value or more, executing a command included in the radio signal;
    a memory coupled to the control unit and responsive to a memory control signal therefrom, to receive or supply data to be stored or stored therein;
    a booster boosting the supply voltage more than a second voltage value that is larger than the first voltage value, to generate a write voltage required for writing to the memory during a write cycle, the booster boosting the supply voltage less than the second voltage value to generate a write voltage and being insufficient for writing to the memory during the write cycle; and
    a detector detecting whether the supply voltage generated by the supply voltage generator is smaller than the second voltage value,
    wherein the control unit does not execute a transmission process corresponding to a read operation in the verify process in response to the supply voltage being smaller than the second voltage value.

2. The semiconductor device for the tag of claim 1, wherein the first voltage value comprises a logic circuit operation threshold voltage.

3. The semiconductor device for the tag of claim 1, further comprising:
    a transmitter being operable on the supply voltage of the first voltage value or more, wherein the transmitter does not transmit a read data corresponding to the read operation in the verify process in response to a transmission control signal from the control unit.

4. The semiconductor device for the tag of claim 1, wherein the control unit does not execute the transmission corresponding to the read operation in the verify process when the supply voltage is smaller than the second value during the write cycle.

5. A semiconductor device for a tag included in a communication system, the communication system including the tag and a reader/writer communicating by a radio signal with the tag, the communication system executing a verify process that the reader/writer reads from the tag a write data to determine whether a write operation is correct or not after the reader/writer writes in the tag the write data, the semiconductor device comprising:
    a supply voltage generator responsive to the radio signal to generate supply voltage therefrom;
    a control unit being operable on the supply voltage of a predetermined voltage value or more, executing a command included in the radio signal;
    a memory coupled to the control unit and responsive to a memory control signal therefrom, to receive or supply data to be stored or stored therein;
    a booster coupled to the supply voltage generator, boosting the supply voltage to generate a boost voltage during a write cycle; and
    a detector detecting whether the boost voltage generated by the booster is smaller than a minimum write voltage required for writing to the memory,
    wherein the control unit does not execute a transmission corresponding to a read operation in the verify process in response to the boost voltage being smaller than the write voltage.

6. The semiconductor device for the tag of claim 5, wherein the predetermined voltage value comprises a logic circuit operation threshold voltage.

7. The semiconductor device for the tag of claim 5, further comprising:
    a transmitter being operable on the supply voltage of the predetermined voltage value or more, wherein the transmitter does not transmit a read data corresponding to the read operation in the verify process in response to a transmission control signal from the control unit.

8. The semiconductor device for the tag of claim 5, wherein the control unit does not execute the transmission process corresponding to the read operation in the verify process when the boost voltage is smaller than the predetermined voltage value during the write cycle.

9. A communication method for a communication system including:
    a reader/writer and a tag, the tag comprising a supply voltage generator responsive to a radio signal from the reader/writer to generate supply voltage therefrom;
    a control unit being operable on the supply voltage of a first voltage value or more, executing a command including in the radio signal;
    a memory responsive to a control signal from the control unit, to receive or supply data to be stored or stored therein; and
    a booster boosting the supply voltage more than a second voltage value that is larger than the first voltage value, to generate a write voltage required for writing to the memory during write cycle, the booster boosting the supply voltage less than the second voltage value to generate a write voltage and being insufficient for writing to the memory during the write cycle, the communication method comprising:

outputting the radio signal from the reader/writer to the tag;

generating the supply voltage from a received radio signal in the supply voltage generator;

detecting whether a generated supply voltage is smaller than the second voltage value;

transmitting from the reader/writer to the tag via the radio signal a write command to make a write process for a predetermined address of the memory execute after the detecting;

transmitting from the reader/writer to the tag via the radio signal a read command to make a read process for the predetermined address of the memory execute after the transmitting the write command; and processing the read command in the control unit, wherein the control unit does not execute a transmission process corresponding to the read command in response to the supply voltage being smaller than the second voltage in the processing.

10. The communication method for the communication system of claim 9, wherein the first voltage value comprises a logic circuit operation threshold voltage.

11. The communication method for the communication system of claim 9, wherein the detecting is done during the write cycle.

12. The semiconductor device of claim 1, wherein said write cycle comprises said verify process.

13. The semiconductor device of claim 12, wherein said control unit, in response to a command in the radio signal, can selectively command a read operation if said supply voltage is at or above said first voltage value.

* * * * *